June 13, 1967 J. D. HUSHER ET AL 3,325,653

CURRENT MODE LOGIC CIRCUIT

Filed Oct. 1, 1964

INVENTORS
JOHN D. HUSHER
WALFRED R. RAISANEN
BY Thomas J. Nikolai
ATTORNEY

United States Patent Office 3,325,65

Patented June 13, 196

3,325,653

CURRENT MODE LOGIC CIRCUIT

John D. Husher, Ellicott City, Md., and Walfred R. Raisanen, St. Paul, Minn., assignors to Sperry Rand Corporation, New York, N.Y., a corporation of Delaware, and Westinghouse Electric Corporation, Pittsburgh, Pa., a corporation of Pennsylvania Filed Oct. 1, 1964, Ser. No. 400,757
4 Claims. (Cl. 307—88.5)

ABSTRACT OF THE DISCLOSURE

A circuit arrangement capable of current mode switching, wherein a common circuit point is coupled to a constant current source, is described. In the circuit, multiple current paths are provided between the common point and a reference potential. A differential amplifier arrangement in which one portion of the circuit includes a transistor conducting to saturation is used as a reference, is described.

Figure 1:
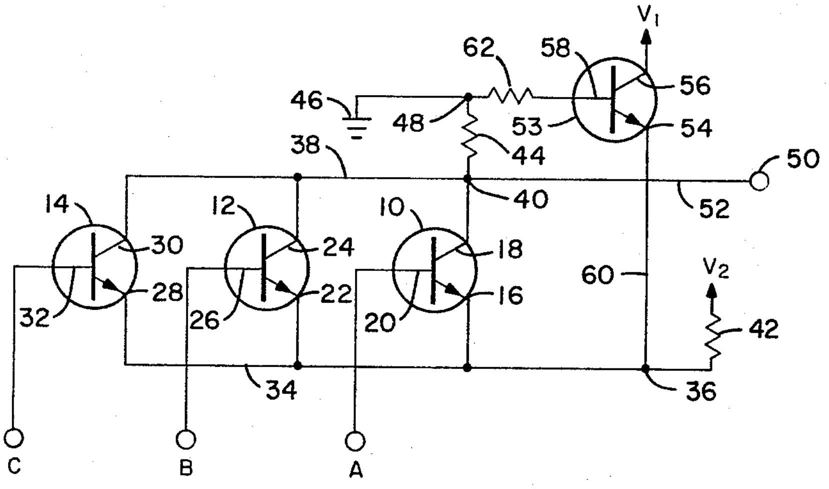

The invention relates to transistor switching circuits and in particular to a transistor current mode logic circuit exhibiting extremely fast rise and fall times and which may be readily constructed in monolithic integrated circuit form.

In attempting to reduce the physical size of electronic circuitry, integrated circuit technology has proved extremely valuable. The integrated circuit approach dispenses with the traditional concept of discrete components and circuit connections to obtain electronic functions. Instead the present knowledge of the structure of matter and solid-state phenomenon is applied to synthesize functional blocks, composed and arranged such a manner that each domain performs an electronic function in transforming and controlling energy flow. This results in a single block of semiconductor material performing the function of a circuit or a subsystem.

In the design and development of semiconductor switching circuitry, a number of limitations have been encountered which have an effect on the speed of operation of the circuits. Examples of these limitations are the minority carrier storage phenomenon which results where the transistors are operated in saturation; the limitations imposed by transistor and circuit capacitances; the alpha cut-off frequency of the transistor; and the transistor diffusion or transit time delay. It has been found that several of the above mentioned limitations are alleviated when the transistors are operated in a region away from saturation. One circuit arrangement for providing non-saturation switching is the so-called current mode logic circuit wherein a common point exists to which is attached a constant current source. Multiple current paths are provided between this common point and the reference potential, each of which has an asymmetric impedance and at least one of which is a transistor. In operation, when the logic circuit is in a first condition indicating one binary value, e.g., a logical "1" signal, the current from the constant current source flows through a first branch of the circuit. When it is desired to switch the circuit to provide the opposite binary value, i.e., a logical "0" signal, an input signal is applied to one of the inputs to the circuit causing the flow of constant current to revert to the other branch.

A typical example of the prior art current mode switching circuit is shown in FIG. 4 of the H. S. Yourke Patent 2,964,652 which issued Dec. 13, 1960. As shown in this patent there are a plurality of paralleled transistors forming one branch of a differential amplifier type current mode logic circuit. The other branch of the amplifier includes a single transistor having its emitter connected t the emitters of the parallel transistors in the first branc and its base connected to a point of fixed potential suc as ground. Where it is desired to obtain faster switchin times and also where it is desired to employ integrate circuit technology, the circuit of the Yourke patent : somewhat undesirable since it requires the simultaneou use of NPN and PNP polarity transistors. This is difficu within the state-of-art of today's integrated circuit tech nology, which most commonly provides only transistor of a single polarity within a single integrated circuit. I order to provide a sharper threshold than possible in circuit of the Yourke patent, in the circuit of the presen invention, a saturated transistor is used as the referenc element in one leg of the current mode differential am plifier type of logic circuit. Because the collector char acteristic of a saturated transistor appears as a very lov drop and low forward impedance diode, better thresh olding is obtained than was available in prior art arrange ments and furthermore, the circuit is found to exibit a higher gain which permits a larger number of fan-in and fan-out connections when used as a logic circuit. Also, the circuit of the present invention may easily be integrated because of the utilization of common collector connection Accordingly, it is a primary object of that present invention to provide an improved current mode logic circuit Another object of this invention is to provide a current mode logic circuit of the differential amplifier type wherein a saturated transistor is used as the referenced element in one leg thereof.

Still another object of the present invention is to provide a current mode logic circuit suitable for use in digital computer applications which is readily adapted to be constructed in integrated circuit form.

Other objects of the invention will be pointed out in the following description and claims and illustrated in the accompanying drawings, which disclose, by way of example, the principle of the invention and the best mode, which has been contemplated, of applying that principle.

Figure 2:
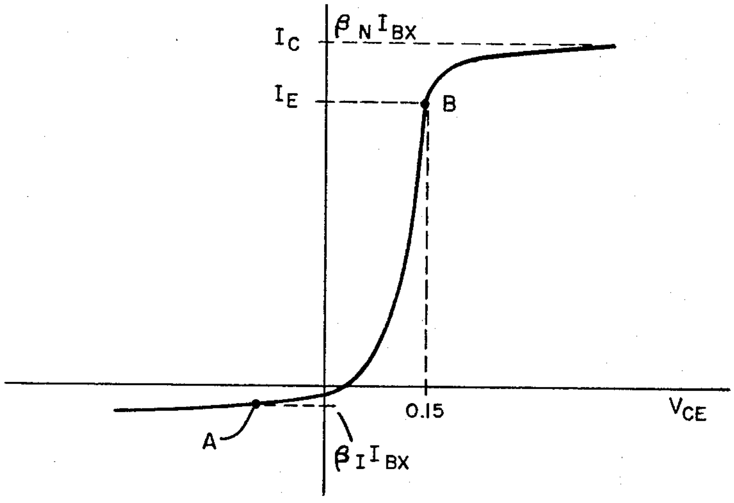

In the drawings:

FIGURE 1 is a schematic diagram of the preferred embodiment of the present invention; and FIG. 2 illustrates the collector characteristics of the referenced transistor employed in the circuit of FIG. 1.

As shown in FIG. 1, the current mode logic circuit of this invention comprises a plurality of semiconductor switching elements, here shown as transistors 10, 12 and 14 which are connected in parallel and which form one leg of a differential amplifier circuit. More specifically, the transistor 10 has an emitter electrode 16, a collector electrode 18 and a base electrode 20.

Similarly, transistor 12 has an emitter electrode 22, a collector electrode 24 and a base electrode 26. Transistor 14 has an emitter electrode 28, a collector electrode 30 and a base electrode 32. While only three transistors are shown as forming the first leg of the differential amplifier, it is possible to parallel additional transistors, depending upon the number of logic inputs desired and, therefore, there is no intent to limit the invention to a circuit having just three logic input terminals.

The emitter electrodes 16, 22 and 28 are connected in common by means of conductor 34 to a first junction point 36. Similarly, the collector electrodes 18, 24 and 30 are connected in common by conductor 38 to a second junction point 40. The junction 36 is connected through a resistor 42 to a source of potential $V_2$. Resistor 42 and potential source $V_2$ comprise a constant current source. The junction point 40 is connected through a resistor 44 to a point of fixed potential such as ground 46 by means of conductor 48. The output signal from the logic circuit is obtained at the terminal 50 which is connected to junction point 40 by means of conductor 52.

The other leg of the differential amplifier includes the ferenced transistor 53. Transistor 53 has an emitter ectrode 54, a collector electrode 56 and a base electrode ;. The emitter electrode 54 of transistor 52 is connected rectly to the junction point 36 by means of conductor ). The collector electrode of the referenced transistor 53 connected to a source of potential $V_1$. Finally, the base ectrode 58 of transistor 53 is connected through a re- stor 62 to the point of fixed potential (ground) 46.

Now that the circuit construction has been explained detail, consideration will be given to the operation of ie circuit as a logic circuit suitable for use in digital omputing equipment.

*Operation*

Depending upon the polarity convention adapted for ie input logic signals, the circuit of FIG. 1 is effective provide either the logical AND-NOT or the logical [OR function. For the purpose of explanation, a logical 1" signal is represented by a negative voltage of a pre- etermined value while the logical "0" is represented by signal of 0 volts. With this convention the circuit per- orms the AND-NOT function. However, if a logical "0" ignal is defined as a negative polarity signal while a ogical "1" signal is defined as an 0 volt signal, the ircuit of FIG. 1 performs the NOR function. It will be bvious to one skilled in the art that PNP transistors may e utilized in place of the NPN transistors illustrated as ong as the power supply voltage polarities are reversed. Iowever, because NPN transistors are more readily in- egrated, they are preferred.

The combination of the resistor 42 and the voltage ource $V_2$ comprises a constant current source which is onnected to the junction point 36. When each of the nput terminals A, B and C has a logical one signal ap- lied to it the transistors 10, 12 and 14 will be in a non- onducting condition and the constant current flow is rom voltage source $V_1$ to collector 56 of transistor 53 nd through to the emitter 54 of transistor 53, through onductor 60 to junction 36 and from there to the con- tant current source comprising a resistor 42 and voltage ource $V_2$. Because under these conditions no current flows hrough the resistor 44, the junction point 40 and the out- ut terminal 50 will be at approximately ground (0) po- ential. This corresponds to a logical "0" output signal.

If the input voltage to any or all of the input ter- minals, A, B and C is near 0 volts, those input transistors will be biased to a conductive state and current will low from the ground terminal 46 through conductor 48, hrough the resistor 44, through conductor 38 and through he collector to emitter paths of the conducting ones of he transistors 10, 12 and 14, through the conductor 34 to junction 36 and from there to the constant current source. Since a current is flowing through the resistor 44 there will be a potential difference between the ground terminal 46 and the junction 40 causing the output ter- minal 50 to be at a negative voltage level (a logical "1" level).

Thus, it can be seen that if any of the inputs, A, B or C have logical 0's applied thereto the output will be a logical "1" signal. It is only when all of the inputs A, B and C are at the logical "1" level that the output will be a logical "0" signal. The output can therefore be expressed in Boolean terms as $\overline{A.B.C.}$ When any input A, B, or C has a logical "0" input thereto such that it is conducting, the voltage drop from said input across the base-emitter junction of its transistor will raise the emitter voltage appearing at the junction 36 to a value which reverse biases the emitter base diode of transistor 53 and forward biases the collector-base diode of transistor 53. This corresponds to the operating point A in FIG. 2. For the reference transistor 53 to perform satisfactorily the "leakage" current $\beta_I I_{BX}$ must be low. The referenced transistor 53 should therefore be chosen to have a low inverse current gain $\beta_I$. Because resistor 62 is connected to a potential source which holds the base 58 positive with respect to the emitter 54, the transistor 53 is supplied with a constant base current, $I_{BX}$, sufficient to keep transistor 53 always saturated. Hence, it is possible to obtain a relatively sharp switching threshold.

If the input voltage to each of the transistors 10, 12, and 14 is relatively negative (a logical "1" signal) all of the input transistors will be nonconducting and transistor 53 will be conducting all of the bias current flowing through resistor 42. Hence, the transistor 53 will have the operating point B of FIG. 2. Since the switching thresholds are sharp, the logic circuit is less subject to noise problems than related circuits which constitute the prior art.

By way of example only, since the choice of component values and voltages depend upon the details of the transistors used, the following values and components may be used in constructing the preferred embodiment of FIG. 1.

| | | |
|---|---|---|
| Resistor **42** | ohms | 220 |
| Resistor **44** | do | 50 |
| Resistor **62** | do | 150 |
| $V_1$ | volts | 0.9 |
| $V_2$ | do | 4.0 |
| Transistors **53**, **10**, **12** and **14** | | Type 2N2368 |

From the above description it will be apparent that we have produced a system and apparatus which possesses all of the features that are set forth as desirable; and while we have described and illustrated what appears to be the preferred form of the invention, we reserve the right to make all changes within the spirit of the invention and without the ambit of the prior art.

What is claimed is:

1. A current mode logic circuit comprising: a plurality of NPN transistors each having emitter base and collector electrodes, said emitter electrodes being connected in common to a first junction point and said collector electrodes being connected in common to a second junction point; a first resistor connected between said first junction point and a first source of potential; a second resistor connected between said second junction point and a second source of potential more positive than said first source of potential; a further NPN transistor having emitter base and collector electrodes, said emitter electrode of said further transistor being connected to said first junction point, said base electrode of said further transistor being connected through a third resistor to said second source of potential and said collector electrode of said further transistor being connected to a source of reference potential such that said further transistor is constantly maintained in a condition of saturation; means for selectively applying bi-valued pulse signals to said base electrodes of said plurality of transistors, and means for obtaining an output signal at said second junction point, the arrangement being such that said output signal is the logical AND-NOT function of said signals applied to the base electrodes of said plurality of transistors.

2. A current mode logic circuit comprising: a plurality of NPN transistors each having emitter base and collector electrodes, said emitter electrodes being connected in common to a first junction point and said collector electrodes being connected in common to a second junction joint; a first impedance connected between said first junction point and a first source of potential; a second impedance connected between said second junction point and a second source of potential more positive than said first; a further NPN transistor having emitter base and collector electrodes, said emitter electrode of said further transistor being connected to said first junction point, said base electrode of said further transistor being connected through a third impedance to said second source of potential and said collector electrode of said further transistor being connected to a source of reference potential such that said further transistor is continuously maintained in a saturated condition; means for selectively applying bi-valued pulse signals to said base electrodes of said plurality of transistors, and means for obtaining an output signal at said second junction point, the arrangement being such that said output signal is the logical AND-NOT function of said signals applied to the base electrodes of said plurality of transistors.

3. A current mode logic circuit comprising: a plurality of semiconductor switching devices each having a pair of output electrodes and a control electrode; means connecting the first of said pair of output electrodes in common to a first junction point and the second of said pair of output electrodes to a second junction point; a source of fixed potential having first and second terminals; means connecting said first terminal to said first junction point; means connecting said second terminal to said second junction point; a further semiconductor switching device having a pair of output electrodes and a control electrode; means connecting a first of said pair of output electrodes to a source of bias potential; means connecting the other of said pair of output electrodes to said second junction point; means connecting said control electrode of said further transistor to said first terminal such that said further transistor is continuously maintained in a saturated condition; and means for selectively applying bi-valued input signals to said input electrodes of said plurality of semiconductor switching elements.

4. A switching circuit comprising: input means f coupling to a current source, a first transistor having fir second and third electrodes, said first electrode coupl to said input means, said second electrode arranged f coupling to a point of fixed potential sufficient to insu that said transistor is continuously maintained in a state current saturation, and said third electrode for couplin to a source of bias potential; a second transistor havin first, second and third electrodes, said first electrode said second transistor connected to said first electrode said first transistor, said second electrode of said secon transistor adapted to receive bi-valued input signals, r sistor means for coupling said third electrode of said se ond transistor to said point of receiving said fixed poter tial; and means for obtaining an output signal from sai third electrode of said second transistor, the arrang ment being such that the switching circuit exhibits we defined switching thresholds.

References Cited

UNITED STATES PATENTS

| | | | |
|---|---|---|---|
| 3,011,068 | 11/1961 | McVey | 328—18 |
| 3,271,590 | 9/1966 | Sturman | 307—88. |

ARTHUR GAUSS, *Primary Examiner.*

B. P. DAVIS, *Assistant Examiner.*

UNITED STATES PATENT OFFICE

CERTIFICATE OF CORRECTION

Patent No. 3,325,653 June 13, 1967

John D. Husher et al.

It is hereby certified that error appears in the above numbered patent requiring correction and that the said Letters Patent should read as corrected below.

Column 1, line 36, after "arranged" insert -- in --; column 2, line 20, for "exibit" read -- exhibit --; column 4, line 24, for "0.9" read -- -0.9 --; line 25, for "4.0" read read -- -4.0 --.

Signed and sealed this 16th day of July 1968.

(SEAL)

Attest:

Edward M. Fletcher, Jr.

Attesting Officer

EDWARD J. BRENNER

Commissioner of Patents